July 2, 1968 A. H. EVANS 3,391,352
OSCILLATOR STARTING CIRCUIT
Filed Oct. 14, 1966
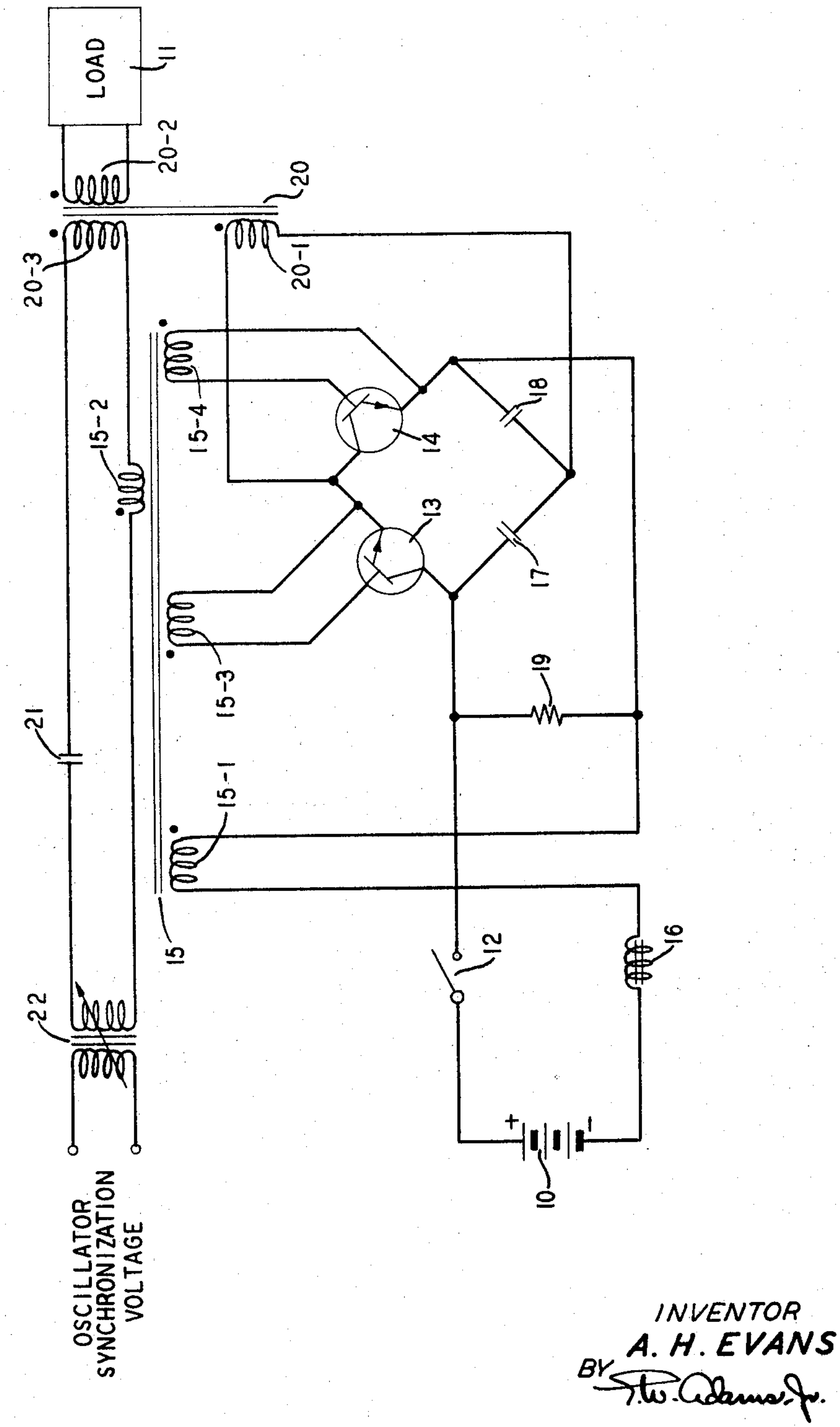
INVENTOR
A. H. EVANS
BY
ATTORNEY United States Patent Office 3,391,352

Patented July 2, 1968

3,391,352

OSCILLATOR STARTING CIRCUIT

Alonzo H. Evans, Somerset, N.J., assignor to Bell Telephone Laboratories, Inc., Berkeley Heights, N.J., a corporation of New York Filed Oct. 14, 1966, Ser. No. 586,892
5 Claims. (Cl. 331—113)

ABSTRACT OF THE DISCLOSURE

In a transistor oscillator a separate starting winding which is inductively coupled to the emitter-base drive windings of the oscillator transistors is connected in series in one leg of the D-C input power circuit. When the D-C input power is applied to the oscillator the initial surge current through the starting winding induces a sufficiently high drive signal into the drive windings to start oscillation.

This invention relates generally to transistor oscillator circuits and, more specifically, to transistor oscillator starting circuits.

Oscillator circuits are used to transform a unidirectional voltage into alternating current. Such oscillators may be of the type that produce a sinusoidal output or have a rectangular output waveform. Transistor oscillator circuits that produce a rectangular type output waveform have their operating frequency determined by either a tuned circuit or by the characteristics of a saturable core transformer. The positive feedback to maintain oscillations is coupled from the output of the oscillator either through the tuned circuit or through the saturable core transformer by suitably connecting the feedback arrangement between the emitter electrode and base electrode of the oscillator transistor to render the transistor alternately conducting or nonconducting. In such oscillator circuits initiation of oscillation, however, requires a sudden surge of current to render the transistor conductive, which in turn starts the oscillations.

Heretofore this required that, at the time of power application to the oscillator, a condition of circuit unbalance existed to assure that the application of power was operative to render the transistor conductive. Various circuit means have been provided for in the prior art for increasing the unbalance condition of the oscillator to assure initiation of operation. Resistance capacitance networks have been connected in the biasing circuit of at least one of such oscillator transistors, for example, to increase the leakage current unbalance of the circuit, thereby tending to assure conduction of that transistor upon power application to start oscillations.

Although oscillators utilizing such prior art starting arrangements have generally been satisfactory for some load applications, they have been inefficient and marginal in those applications in which oscillations have to be started under heavy initial load conditions.

The primary object of the invention is to improve the starting characteristics of oscillators.

Another object of the invention is to provide for oscillator circuits that start oscillations even under initial heavy load conditions.

A further object of the invention is to provide for an oscillator that has a simple and reliable starting arrangement.

Still another object of the invention is to increase the efficiency of oscillator starting circuits.

To fulfill these objects, the invention provides in an oscillator circuit for a separate starting winding which is connected in series in one leg of the direct-current input power circuit, and which is inductively coupled to the emitter-base drive winding of the oscillator transistor. When the direct-current input power is applied to the oscillator, the initial surge current through the starting winding induces a sufficiently high drive signal into the drive winding to start oscillation.

More specifically, one embodiment of the invention includes an oscillator having the emitter-collector paths of two transistors connected in series across the direct-current source. The series combination of two capacitors is connected in parallel with the two oscillator transistors, and the load is connected between the junctions of the transistors on one side, and the junction of the capacitors on the other side. A feedback arrangement between the load and the respective emitter-base paths of the transistors includes a tuned circuit to maintain and determine the frequency of oscillations. In order to provide for the proper starting of oscillation upon power application to the oscillator, a starting winding is connected in series between the source and the parallel combination of the transistors and capacitors and is inductively coupled to the feedback windings of the emitter-base paths of the oscillator transistors. Upon application of power to the oscillator the two capacitors across the load charge almost instantaneously, thereby generating a surge current from the source through the starting winding. This surge current in the starting winding is inductively coupled to the emitter-base drive windings to generate sufficient energy to forward bias one of the oscillator transistors and render it conductive, thereby starting oscillations. Once oscillations have started they are maintained and have a frequency that is determined by a combination of the standard feedback arrangement together with the tuned circuit.

The above and other features of the invention will be more fully understood from the following detailed description. The single figure of the drawing is a schematic diagram of a specific embodiment of the invention. In the illustrated oscillator, power from direct-current source 10 is converted to alternating current to be delivered to load 11. The power is supplied from the positive terminal of source 10 through power switch 12 to the collector electrode of oscillator transistor 13. The emitter electrode of transistor 13 is, in turn, connected to the collector electrode of transistor 14, and the emitter electrode of transistor 14 is then returned through starting winding 15–1 of feedback transformer 15 and through filter choke 16 to the negative terminal of source 10. Oscillator transistors 13 and 14 are both n-p-n transistors. The serially connected emitter-collector paths of transistors 13 and 14 are paralleled by the series combination of capacitors 17 and 18, where one terminal of capacitor 17 is connected to the collector electrode of transistor 13 and one terminal of capacitor 18 is connected to the emitter electrode of transistor 14, and where capacitors 17 and 18 each have another terminal connected together. A bleeder resistor 19 is connected across the series combination of capacitors 17 and 18 to provide for a capacitor discharge path when power is disconnected from the oscillator.

The alternating-current output power is coupled to load 11 through output transformer 20 which has one terminal of its primary winding 20–1 connected to the junction of capacitors 17 and 18, and another terminal connected to the junction of the emitter electrode of transistor 13 and the collector electrode of transistor 14. The output power circuit is completed through secondary winding 20–2 which has its terminals connected to the load.

Positive feedback to maintain oscillations is obtained from the oscillator output through a feedback winding 20–3 of output transformer 20. The feedback is coupled through winding 20–3 to a tuned circuit comprising in combination the serially connected winding 20–3, tuning capacitor 21, one winding of synchronization coupling transformer 22, and primary winding 15–2 of feedback transformer 15. That is, one terminal of winding 20–3 is connected to one terminal of capacitor 21 whereas another terminal of capacitor 21 is connected to one terminal of transformer 22 and another terminal of transformer 22 is returned through primary winding 15–2 to the other terminal of winding 20–3. Synchronization coupling transformer 22 serves one of two distinct purposes. It is used either to couple a synchronization signal from the tuned circuit to other oscillators operating in parallel and in synchronism with the illustrated oscillator or it may be used to accept a synchronization signal from external oscillators to govern the frequency of oscillations of the illustrated oscillator. Transformer 22 also incorporates an adjustable inductance which is variable to tune the tank circuit and thereby controls the frequency of oscillations of the oscillator.

Drive energy for oscillator transistors 13 and 14 is deriver through feedback windings 15–3 and 15–4, respectively, of feedback transformer 15 from the tuned circuit. Each of the windings 15–3 and 15–4 has one of its terminals connected to the base electrode and another terminal connected to the emitter electrode of a respective oscillator transistor.

Before power is applied to the oscillator circuit, capacitors 17 and 18 are discharged through resistor 19 and transistors 13 and 14 both are nonconducting. When power switch 12 is closed, however, to apply power from source 10 to the oscillator, capacitors 17 and 18 immediately start to charge to the source voltage. The charging current flows from source 10 through switch 12, capacitors 17 and 18, starting winding 15–1 and choke 16 back to the source. Starting winding 15–1 is in turn inductively coupled to drive windings 15–3 and 15–4 with a polarity as indicated by the dots in the drawing. That is, the initial surge current entering winding 15–1 on its dot side induces in-phase currents on the dot sides of windings 15–3 and 15–4, respectively. As a result of the surge current through starting winding 15–1 a voltage is induced in winding 15–4 which cuts off transistor 14, and a voltage is induced in winding 15–3 which forward biases the base-emitter junction of transistor 13, causing transistor 13 to conduct.

Capacitors 17 and 18 are chosen to be so large as to present substantially short circuits at the operating frequency of the oscillator. That is, as transistor 13 conducts the conduction path from the source is completed through capacitor 18, whereas the conduction path is completed through capacitor 17 when transistor 14 conducts.

With transistor 13 conducting as a result of the surge current through winding 15–1, power from direct-current source 10 flows from its positive terminal through switch 12, through the collector-emitter path of transistor 13, winding 20–1, capacitor 18, starting winding 15–1, and through choke 16 back to the negative terminal of source 10. The resultant current pulse through winding 20–1, in addition to being coupled through winding 20–2 to load 11, is also inductively coupled through winding 20–3 into the tank circuit as positive feedback. This positive feedback causes oscillations to start in the tank circuit at a frequency which is primarily determined by the capacitance of capacitor 21 and the inductance of transformer 22. The initial half cycle of oscillation in the tank circuit that is induced as a result of the surge current is of such polarity as to support the conduction of transistor 13 through feedback winding 15–3, while cutting off transistor 14 through feedback winding 15–4.

In the next succeeding half cycle the polarity of the oscillations in the tank circuit reverse so that the voltage induced in feedback winding 15–3 cuts off transistor 13, whereas the voltage induced in feedback winding 15–4 forward biases the base-emitter junction of transistor 14, causing it to conduct instead. During the conduction of transistor 14, power is supplied from direct-current source 10 through switch 12, capacitor 17, primary winding 20–1, the collector-emitter path of transistor 14, starting winding 15–1, and choke 16 back to the negative terminal of source 10. In alternating half cycles transistors 13 and 14 are therefore rendered alternately conductive, thereby repeating the resective conduction cycles and generating alternating-current power for the load.

Starting winding 15–1 is wound in such a way and is of such construction as not to saturate during normal load current conditions. That is, the winding is effective only during the initial surge current when power is first applied, to assure starting of oscillations irrespective of oscillator load conditions.

This invention provides therefore for a simple, reliable, and efficient oscillator starting means that effectively starts oscillations even under heavy initial load conditions.

It is to be understood that the above-described arrangement is illustrative of the application of the principles of the invention. Numerous other arrangements may be devised by those skilled in the art without departing from the spirit and scope of the invention.

What is claimed is:

1. An oscillator circuit which comprises a source of direct input curent, a load, a first and a second transistor each having an emitter electrode, a collector electrode, and a base electrode, a first and second coupling capacitor, means connecting said first and second transistors to conduct current in their respective emitter-collector paths from said source through a respective coupling capacitor to said load in one direction from one of said transistors and in the opposite direction from the other of said transistors, and feedback means connected to provide regenerative feedback between the emitter-collector paths and the emitter-base paths of respective transistors to render the emitter-collector paths of said transistors alernately conducting and substantially nonconducting in phase opposition to one another, said feedback means including at least one feedback transformer having its primary winding coupled to the emitter-collector paths and its secondary windings coupled to the respective base-emitter paths of said transistors, whereby a portion of the emitter-collector current is fed back to the respective emitter-base paths of said transistors, said feedback transformer having an additional input winding connected in series with said source of direct input current between one terminal of said source and the emitter-collector path of said transistors to generate a starting impulse in response to the urge current from said source to said coupling capacitors upon turn-on of the oscillator, said starting impulse being coupled to the emitter-base paths of said transistors to assure starting of oscillations even under heavy initial load conditions.

2. An oscillator circuit in accordance with claim 1 in which said load includes an output transformer having one of the terminals of its primary winding connected to the junction point of the collector electrode of one of said transistors and the emitter electrode of the other of said transistors, and having the other terminal of its primary winding connected to the junction of said coupling capacitors.

3. An oscillator in accordance with claim 1 in which said feedback means includes a tank circuit tuned to determine the frequency of oscillation of said oscillator.

4. An oscillator which comprises a source of direct input current, a first and a second transistor each having an emitter electrode, a base electrode, and a collector electrode, a first and a second coupling capacitor, a load, the collector electrode of said first transistor being connected to one terminal of said source and to one terminal of said first capacitor, said first capacitor having its other terminal connected to one terminal of said second capacitor and said second capacitor having its other terminal connected to the junction point of the emitter electrode of said second transistor and another termnal of said source, means to couple said load to the junction point of said capacitors and to the junction point of the emitter electrode and collector electrode of said first and second transistors, respectively, and feedback means connected to provide regenerative feedback between the emitter-collector paths and the base-emitter paths of respective transistors to render the emitter-collector paths of said transistors alternaely conducting and substantially nonconducting in phase opposition to one another, thereby supplying current to said load in one direction from one of said transistors and in the opposite direction from the other of said transistors, said feedback means including at least one feedback transformer having its primary winding coupled to the emitter-collector paths of said transistors and having its secondary windings coupled to the respective base-emitter paths of said transistors, whereby a portion of the emitter-collectod current is fed back to the respective emitter-base paths of said transistors, said feedback transformer having an additional input winding connected in series with said source of direct input current between one terminal of said source and the emitter-collector path of said transistors to generate a starting impulse in response to the surge current from said source to said coupling capacitors upon turn-on of the oscillator, said starting impulse being coupled to the emitter-base paths of said transistors to assure starting of oscillations even under heavy initial load conditions.

5. An oscillator in accordance with claim 4 in which said additional input winding of said feedback transformer is connected between said other terminal of said source and the junction point of the emitter electrode of said second transistor and said second capacitor.

References Cited

UNITED STATES PATENTS

| | | | |
|---|---|---|---|
| 3,215,952 | 11/1965 | Massey ___________ | 331—113.1 |
| 3,231,833 | 1/1966 | Cooper ___________ | 331—113.1 |
| 3,268,833 | 8/1966 | Miller et al. ______ | 331—113.1 |

JOHN KOMINSKI, *Primary Examiner.*